(12) United States Patent  
Cai et al.

(10) Patent No.: US 11,855,195 B2  
(45) Date of Patent: Dec. 26, 2023

(54) TRANSISTOR WITH WRAP-AROUND EXTRINSIC BASE

(71) Applicant: GLOBALFOUNDRIES Singapore Pte. Ltd., Singapore (SG)

(72) Inventors: Xinshu Cai, Singapore (SG); Shyue Seng Tan, Singapore (SG); Vibhor Jain, Williston, VT (US); John J. Pekarik, Underhill, VT (US); Kien Seen Daniel Chong, Singapore (SG); Yung Fu Chong, Singapore (SG); Judson R. Holt, Ballston Lake, NY (US); Qizhi Liu, Lexington, MA (US); Kenneth J. Stein, Sandy Hook, CT (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 54 days.

(21) Appl. No.: 17/509,604

(22) Filed: Oct. 25, 2021

(65) Prior Publication Data

US 2023/0127768 A1   Apr. 27, 2023

(51) Int. Cl.
*H01L 29/737* (2006.01)
*H01L 29/66* (2006.01)
*H01L 29/45* (2006.01)
*H01L 29/10* (2006.01)

(52) U.S. Cl.
CPC ...... *H01L 29/7371* (2013.01); *H01L 29/1004* (2013.01); *H01L 29/45* (2013.01); *H01L 29/66242* (2013.01)

(58) Field of Classification Search
CPC ............ H01L 29/7371; H01L 29/7378; H01L 29/1004; H01L 29/66242
See application file for complete search history.

(56) References Cited

U.S. PATENT DOCUMENTS

| | | | |
|---|---|---|---|
| 5,338,694 A | 8/1994 | Ilderem et al. | |
| 6,767,797 B2 | 7/2004 | Krutsick | |
| 6,806,554 B2 | 10/2004 | Hsu | |
| 7,105,415 B2 | 9/2006 | Bock et al. | |
| 8,536,012 B2 | 9/2013 | Camillo-Castillo et al. | |
| 10,777,668 B2 | 9/2020 | Jain et al. | |
| 2005/0104160 A1 | 5/2005 | Ahmed et al. | |
| 2005/0121748 A1* | 6/2005 | Ahlgren | H01L 29/732 257/E29.183 |

(Continued)

OTHER PUBLICATIONS

Specification and drawings for U.S. Appl. No. 17/509,611, filed Oct. 25, 2021, 22 pages.

(Continued)

*Primary Examiner* — Syed I Gheyas
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to transistor with wrap-around extrinsic base and methods of manufacture. The structure includes: a substrate; a collector region within the substrate; an emitter region over the substrate and which comprises mono-crystal silicon based material; an intrinsic base under the emitter region and comprising semiconductor material; and an extrinsic base surrounding the emitter and over the intrinsic base.

17 Claims, 6 Drawing Sheets

(56) References Cited

U.S. PATENT DOCUMENTS

| | | | |
|---|---|---|---|
| 2005/0212087 A1 | 9/2005 | Akatsu et al. | |
| 2007/0051980 A1 | 3/2007 | Hodge et al. | |
| 2007/0238258 A1* | 10/2007 | Adam | H01L 29/1004 |
| | | | 257/592 |
| 2009/0108300 A1 | 4/2009 | Gluschenkov et al. | |
| 2014/0151750 A1* | 6/2014 | Camillo-Castillo | H01L 29/66242 |
| | | | 438/318 |
| 2018/0226347 A1* | 8/2018 | Stamper | H01L 29/0649 |
| 2020/0066885 A1 | 2/2020 | Jain et al. | |
| 2020/0357796 A1* | 11/2020 | Adusumilli | H01L 29/7378 |

OTHER PUBLICATIONS

Office Action in U.S. Appl. No. 17/509,611 dated Mar. 15, 2023, 15 pages.
Response to Office Action in U.S. Appl. No. 17/509,611 dated May 30, 2023, 14 pages.
Notice of Allowance in U.S. Appl. No. 17/509,611 dated Jul. 18, 2023, 11 pages.

* cited by examiner

TRANSISTOR WITH WRAP-AROUND EXTRINSIC BASE

GOVERNMENT CONTRACT

This invention was made with government support under DARPA T-MUSIC HR011-20-3-0002 awarded by DARPA. The government has certain rights in the invention.

FIELD OF THE INVENTION

The present disclosure relates to semiconductor structures and, more particularly, to a transistor with a wrap-around extrinsic base and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. HBTs are used in power amplifier and cellular applications, amongst others, and require low collector-base capacitance (Ccb), low base resistance (Rb), high cut-off frequencies (fT/fMAX) and high breakdown voltage (BVceo). However, current integration schemes for fabricating the HBT result in high Ccb (parasitic capacitance) and high Rb, which is a concern in bipolar technologies as it limits device scaling for improved fT/fMAX.

SUMMARY

In an aspect of the disclosure, a structure comprises: a substrate; a collector region within the substrate; an emitter region over the substrate and which comprises mono-crystal silicon based material; an intrinsic base under the emitter region and comprising semiconductor material; and an extrinsic base surrounding the emitter and over the intrinsic base.

In an aspect of the disclosure, a structure comprises: a collector region within a substrate; a raised intrinsic base over the substrate; an emitter comprising mono-crystalline semiconductor material over the raised intrinsic base; an insulator material on sidewalls of the emitter; an extrinsic base comprising mono-crystalline semiconductor material surrounding the emitter and the raised intrinsic base, the extrinsic base being separated from the emitter by the insulator material; and silicide over the extrinsic base.

In an aspect of the disclosure, a method comprises: forming a collector region within a substrate; forming an emitter region over the substrate and which comprises mono-crystalline silicon based material; forming an intrinsic base under the emitter region and comprising semiconductor material; and forming an extrinsic base surrounding the emitter and over the intrinsic base.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a transistor with a wrap-around extrinsic base and methods of manufacture. More specifically, the transistor is a heterojunction bipolar transistor with a wrap-around extrinsic base and silicide on the extrinsic base. Advantageously, the wrap-around extrinsic base wraps around the intrinsic base and allows higher surface area for silicide and ohmic contact formation resulting in a lower $R_B$ (e.g., approximately 17% lower $R_B$) and higher $F_{MAX}$ (e.g., approximately 10% higher $F_{MAX}$) compared to conventional integration schemes.

In embodiments, the transistor is a heterojunction bipolar transistor with a wrap-around extrinsic base over an intrinsic base. The wrap-around extrinsic base (and silicide) may be provided above the intrinsic base and surrounding the emitter region. In embodiments, the wrap-around extrinsic base comprises epitaxially grown Si material and the emitter comprises mono-crystalline semiconductor material, e.g., Si. The extrinsic base may also be other semiconductor materials such as SiGe. The silicide of the extrinsic base may also wrap-around the extrinsic base. The intrinsic base may be a raised intrinsic base comprising SiGe material.

The transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the transistor of the present disclosure have been adopted from integrated circuit (IC) technology. For example, the structures are built on wafers and are realized in films of material patterned by photolithographic processes on the top of a wafer. In particular, the fabrication of the transistor uses three basic building blocks: (i) deposition of thin films of material on a substrate, (ii) applying a patterned mask on top of the films by photolithographic imaging, and (iii) etching the films selectively to the mask.

Figure 1:
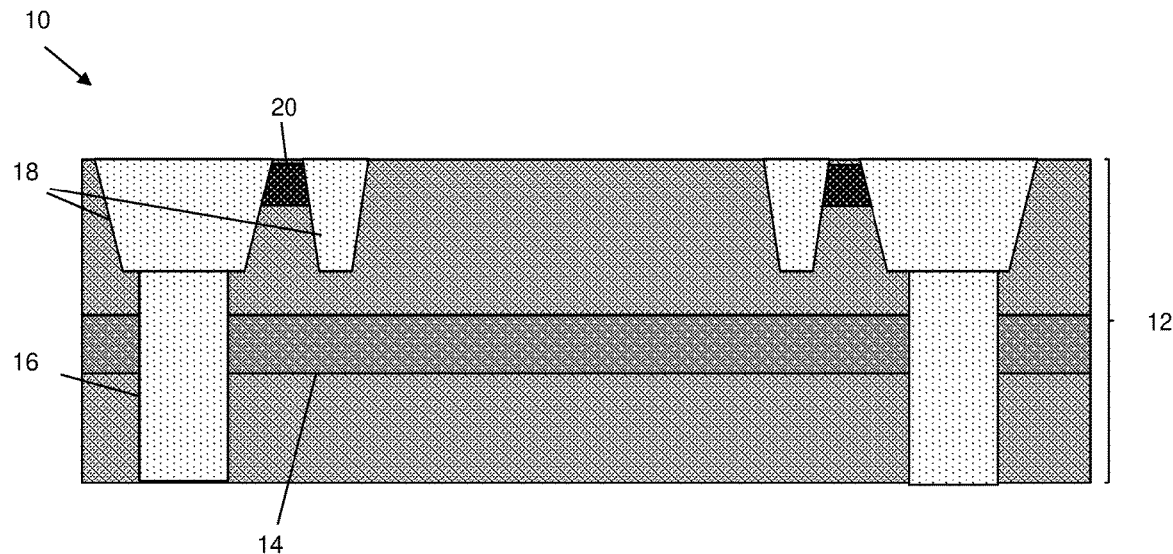
FIG. 1 shows a substrate with a collector region, amongst other features, and respective fabrication processes in accordance with aspects of the present disclosure.

FIG. 1 shows a substrate with a collector region, amongst other features, and respective fabrication processes. More particularly, the structure 10 of FIG. 1 includes a substrate 12 comprising semiconductor material. In embodiments, the substrate 12 may be a semiconductor-on-insulator (SOI) substrate or a bulk substrate composed of any suitable material including, but not limited to, Si, SiGe, SiGeC, SiC, GaAs, InAs, InP, and other III/V or II/VI compound semiconductors. The substrate 12 may be a single crystalline substrate of any suitable crystallographic orientation (e.g., a (100), (110), (111), or (001) crystallographic orientation).

Still referring to FIG. 1, a collector region 14 may be provided within the substrate 12. For example, the collector region 14 may be buried within the substrate 12 (e.g., buried collector) and may comprise an N+ doped implant. In embodiments, the n-type dopants may be, e.g., Arsenic (As), Phosphorus (P) and Sb, among other suitable examples.

The collector region 14 may be formed by an ion implantation process that introduces a concentration of a dopant in the substrate 12. In the ion implantation process, for example, a patterned implantation mask may be used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

Deep trench isolation structures 16 and shallow trench isolation structures 18 may be formed in the substrate 12. The deep trench isolation structures 16 and the shallow trench isolation structures 18 may be formed in separate lithography, etching and deposition processes. For example, a resist formed over the substrate 12 is exposed to energy (light) to form a pattern (opening). An etching process with a selective chemistry, e.g., reactive ion etching (RIE), will be used to transfer the pattern from the photoresist to the substrate 12 to form one or more trenches within the substrate 12. Following the resist removal by a conventional oxygen ashing process or other known stripants, insulator material (e.g., oxide-based material) may be deposited within the trenches by any conventional deposition process, e.g., chemical vapor deposition (CVD) processes. Any residual insulator material on the surface of the substrate 12 can be removed by conventional chemical mechanical polishing (CMP) processes.

A plurality of wells 20 may be formed in the substrate 12, between the shallow trench isolation structures 18. In embodiments, the wells 20 may be formed by an ion implantation process as already described herein. The wells 20 may be N+ doped wells, as an example. The N-type dopant may be, e.g., As or Ph. The wells 20 may be used to electrically connect (e.g., directly contact) to the buried n+ well, e.g., collector region 14.

Figure 2:
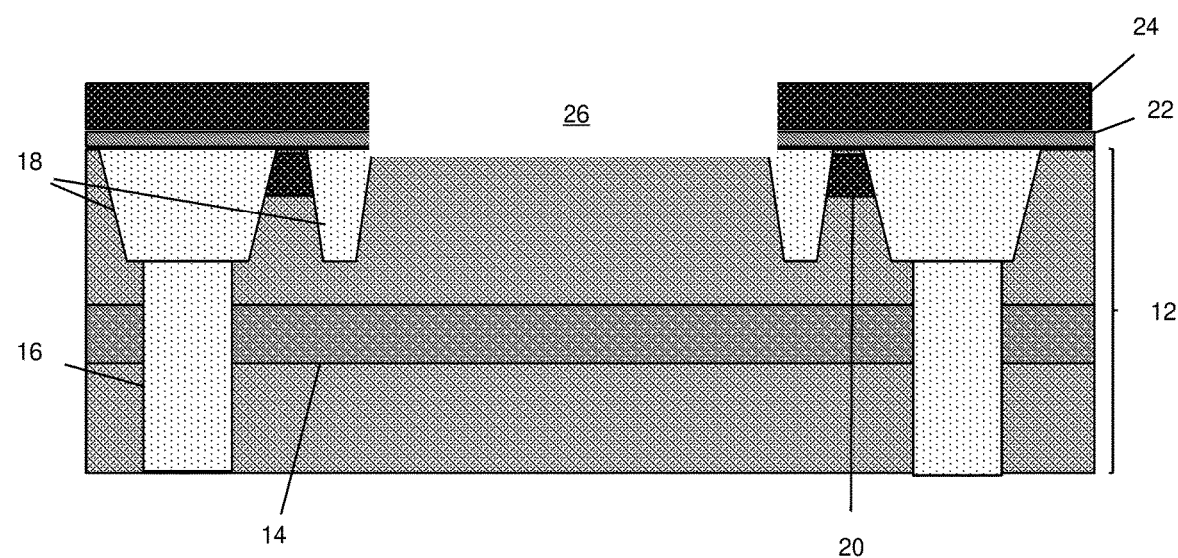
FIG. 2 shows a cap layer and hardmask on the substrate, amongst other features, and respective fabrication processes in accordance with aspects of the present disclosure.

In FIG. 2, a cap layer 22 and hardmask 24 may be formed on the substrate 12. In embodiments, the cap layer 22 may be $SiO_2$ and the hardmask 24 may be SiN, both of which are blanket deposited using any conventional deposition method such as CVD. An opening 26 is formed through the cap layer 22 and hardmask 24 to expose the underlying substrate 12. In embodiments, the opening 24 is between the shallow trench isolation structures 18. The opening 24 may be formed by conventional lithography and etching processes as already described herein such that no further explanation is required for a complete understanding of the present disclosure.

Figure 3:
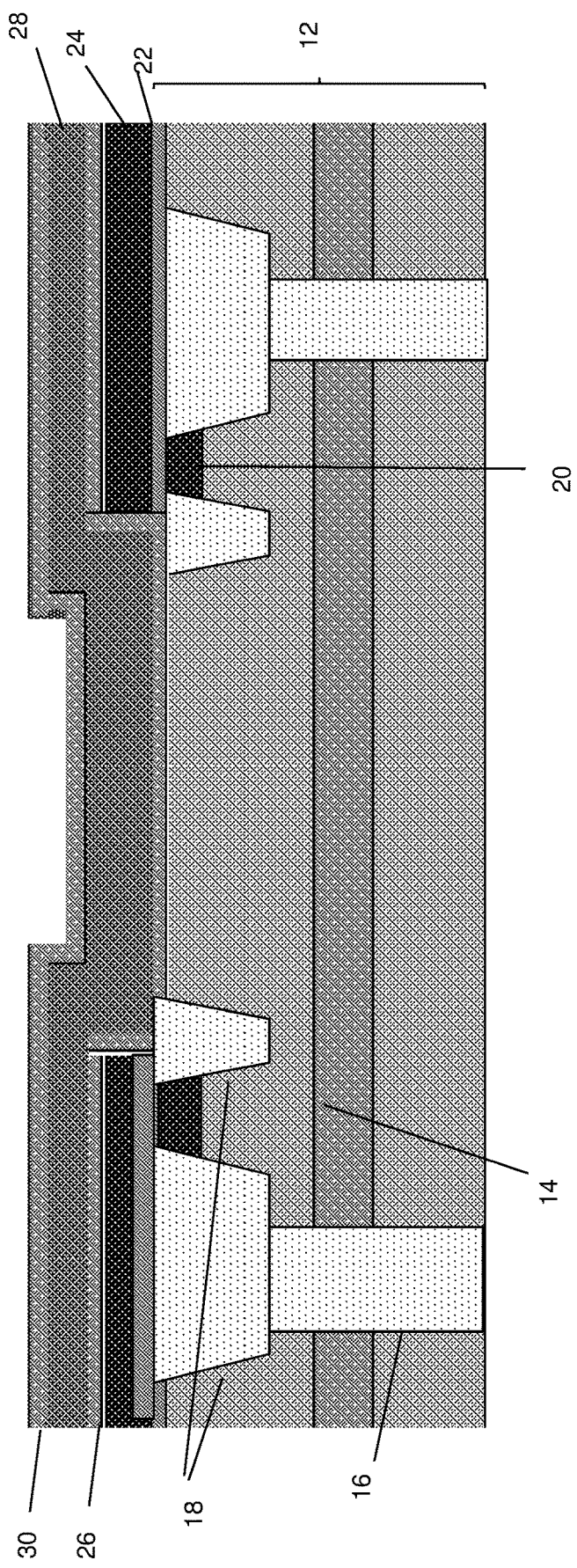
FIG. 3 shows semiconductor materials on the hardmask, amongst other features, and respective fabrication processes in accordance with aspects of the present disclosure.

FIG. 3 shows a plurality of semiconductor materials 26, 28, 30, all of which are formed over the hardmask 24 and within the opening 26. In embodiments, the plurality of semiconductor materials 26, 28, 30 may be formed by either selective or non-selective epitaxial growth processes. The semiconductor materials 26, 30 may be undoped Si material and the semiconductor material 28 may be SiGe material. The SiGe material 28 may be used to form a raised SiGe intrinsic base. The semiconductor material 26 may act as an intrinsic emitter region and the semiconductor material 30 may act as an intrinsic collector region. The raised SiGe intrinsic base is on/overlaps with the shallow trench isolation structure 18. In further embodiments, the raised SiGe intrinsic base extends to two shallow trench isolation structures 18.

Figure 4:
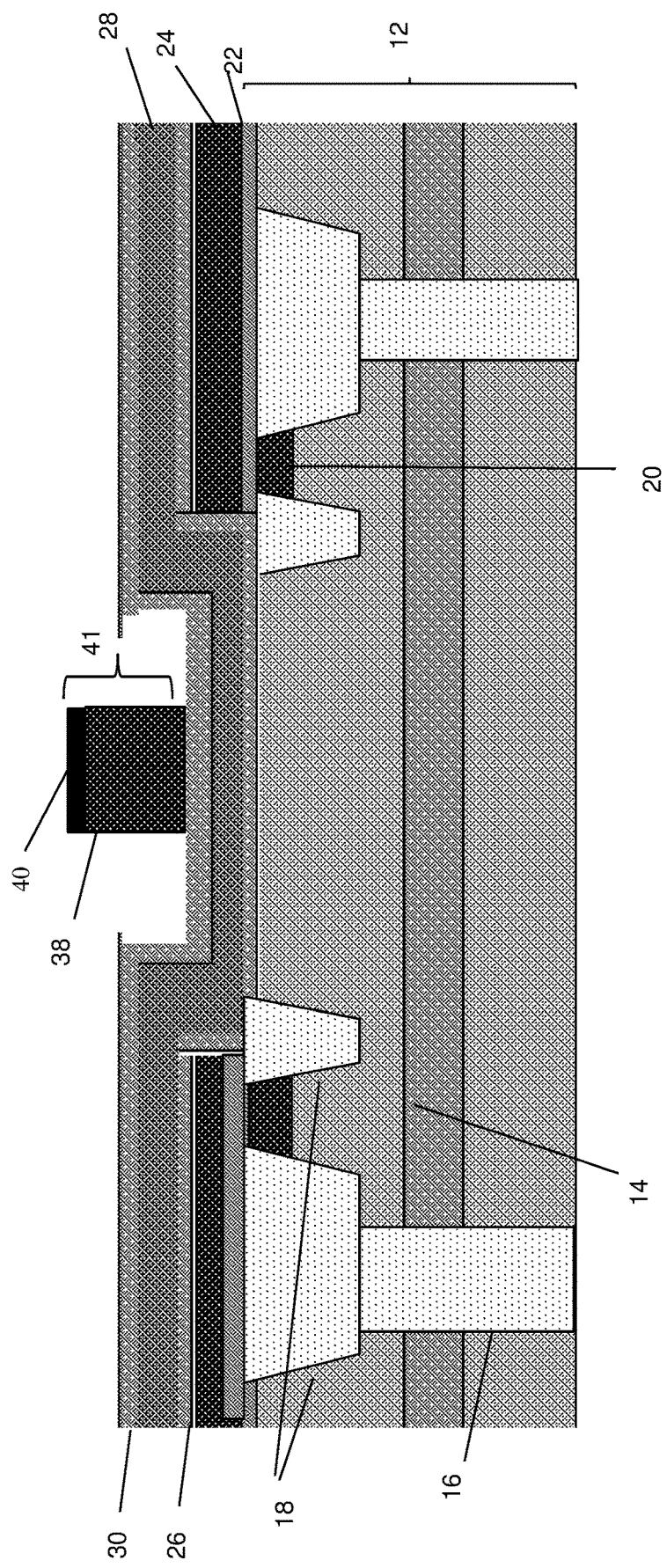
FIG. 4 shows an emitter region, amongst other features, and respective fabrication processes in accordance with aspects of the present disclosure.

FIG. 4 shows an emitter region and respective fabrication processes. Specifically, as further shown in FIG. 4, a silicon-based material 38 and cap material 40 may be formed over the semiconductor material 30. The silicon-based material 38 may be a highly doped N+ mono-crystalline silicon material. A cap material 40 may be formed over the material 38. The semiconductor material 38 may be formed by an epitaxial growth process; whereas the cap material 40 may formed by a blanket deposition process known to those of skill in the art. The cap layer 40 may be an SiN layer. The semiconductor material 38 and the cap material 40 may be patterned using conventional lithography and etching processes to form an emitter region on the semiconductor material 30, as designated at reference numeral 41.

Figure 5:
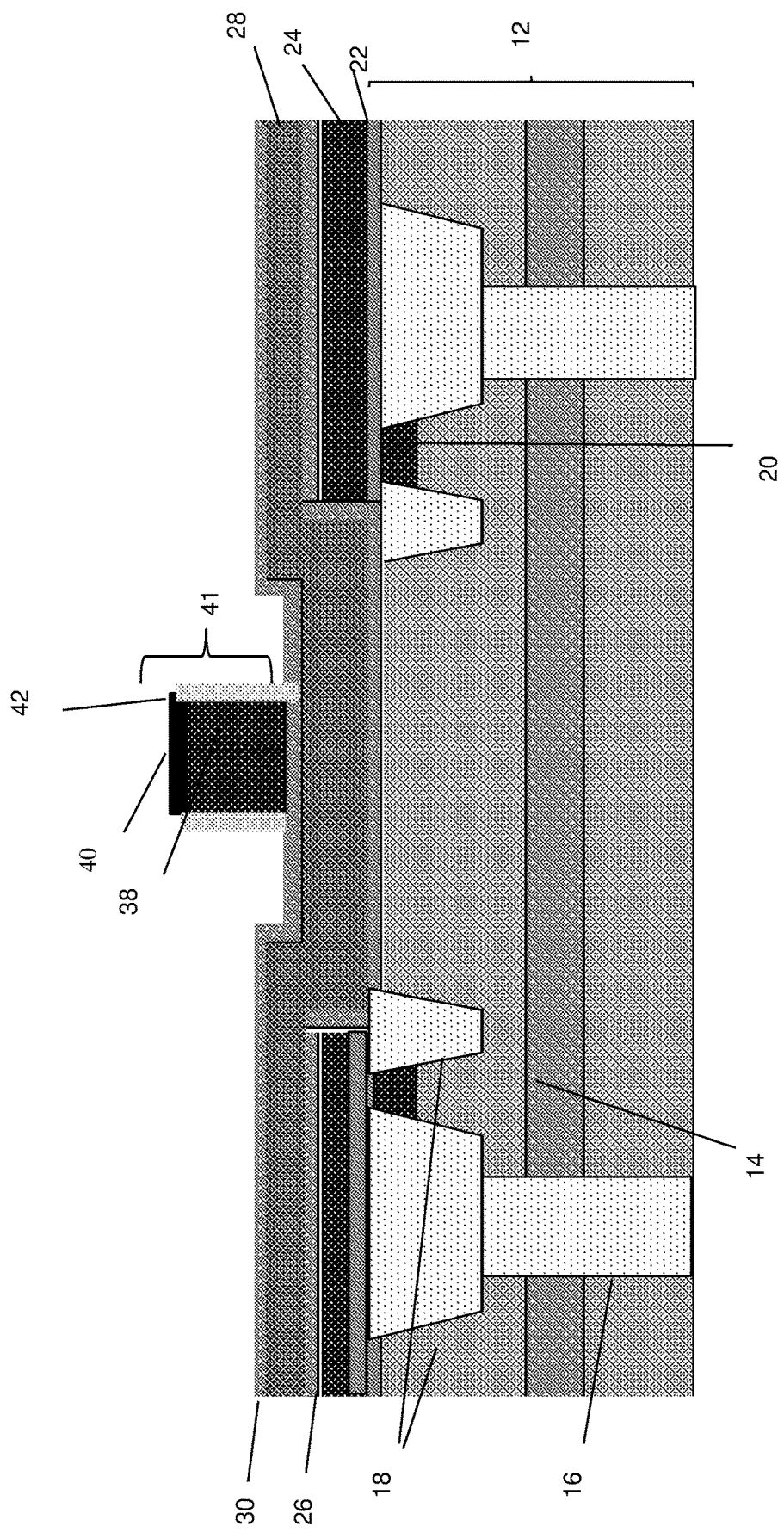
FIG. 5 shows a spacer surrounding the emitter region, amongst other features, and respective fabrication processes in accordance with aspects of the present disclosure.

In FIG. 5, a sidewall spacer material 42 is formed on sidewalls of the emitter region 41, i.e., semiconductor material 38 and cap layer 40. In embodiments, the sidewall spacer material 42 may be SiN material. By an anisotropic etching process, the sidewall spacer material 42 may be removed from horizontal surfaces of the structure, i.e., over the cap layer 40 and semiconductor material 30, resulting in a spacer 42 on sidewalls of the emitter region 41.

Figure 6:
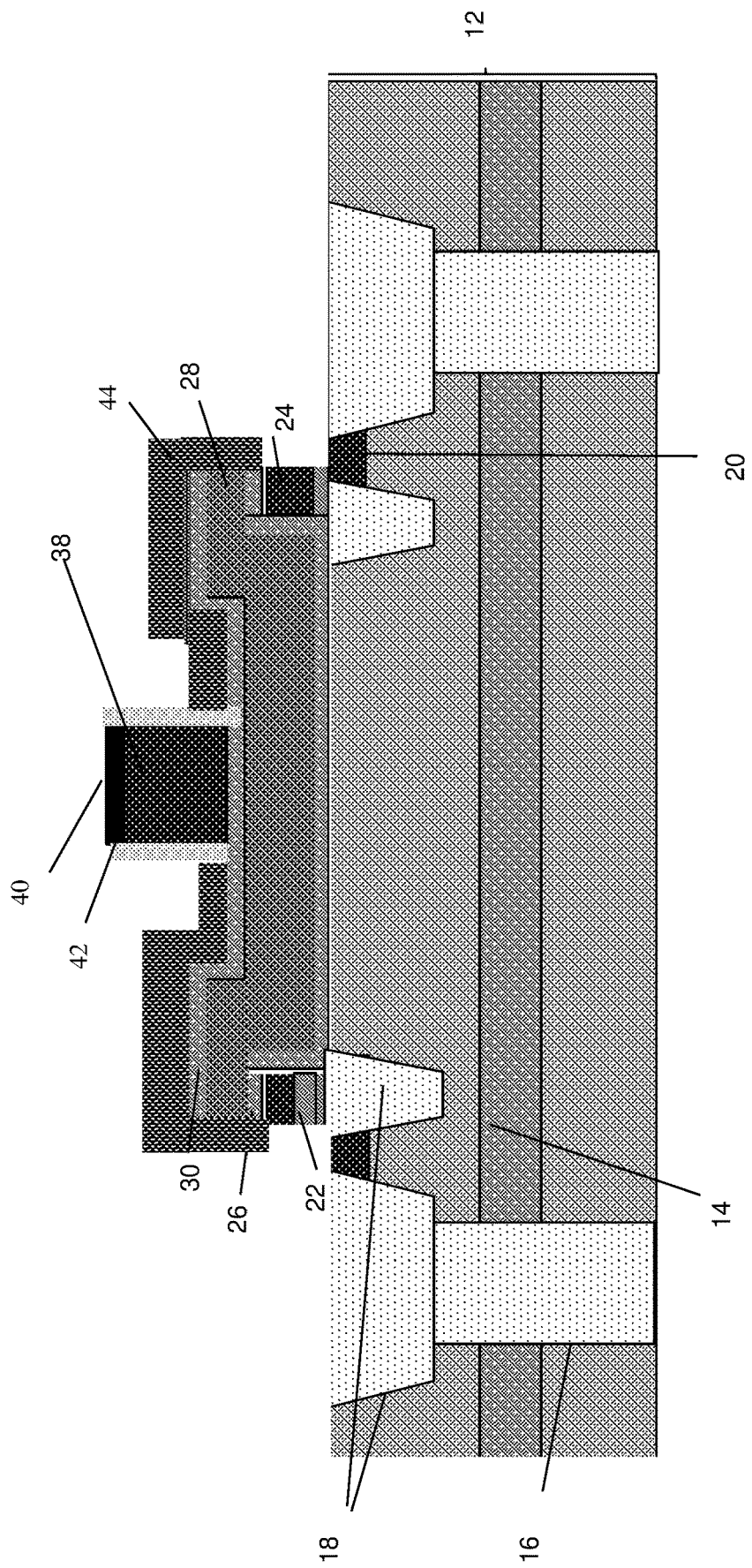
FIG. 6 shows an extrinsic base around the emitter region, amongst other features, and respective fabrication processes in accordance with aspects of the present disclosure.

In FIG. 6, the materials 22, 24, 26, 28, 30 are patterned by conventional etching processes, e.g., RIE. For example, the SiGe material 28 is patterned into a raised SiGe intrinsic base (e.g., single crystalline semiconductor material). An epitaxial semiconductor material 44 may be provided on the exposed materials, e.g., patterned materials 22, 24, 26, 28, 30 and the well 20. The epitaxial semiconductor material 44 may be a P+ doped semiconductor material such as Si material or SiGe material which acts as an extrinsic base. In accordance with aspects described herein, the epitaxial semiconductor material 44 surrounds the emitter region 41, e.g., emitter material 38. Moreover, the epitaxial semiconductor material 44 may be Si material or SiGe material. The epitaxial semiconductor material 44 may be separated from the emitter material 38 by the spacer 42.

Figure 7:
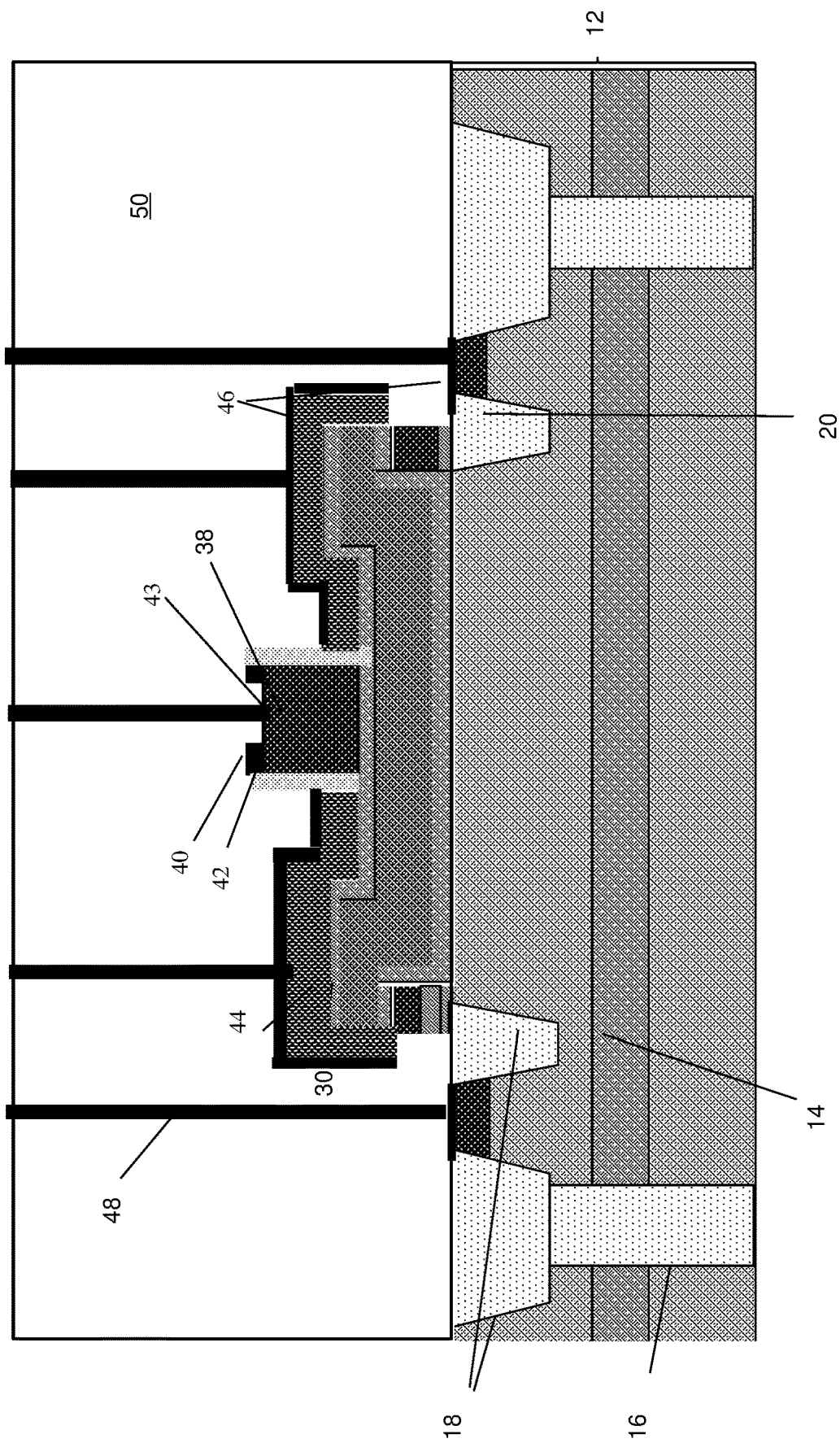
FIG. 7 shows a silicide on the extrinsic base and emitter region, and contacts to the silicide, amongst other features, and respective fabrication processes in accordance with aspects of the present disclosure.

As further shown in FIG. 7, a silicide 46 is formed on the semiconductor material 44 (e.g., extrinsic base) and the wells 20. In addition, the silicide 46 surrounds or wraps around the semiconductor material 44 (e.g., extrinsic base), the intrinsic base material, e.g., semiconductor material 26, and intrinsic collector material, e.g., semiconductor material 28. Prior to the silicide process, an opening 43 may be formed in the cap layer 40 to expose the semiconductor material 38 of the emitter region 41. This may be performed by conventional lithography and etching processes as already described herein.

As should be understood by those of skill in the art, the silicide process begins with deposition of a thin transition metal layer, e.g., nickel, cobalt or titanium, over the semiconductor material 44, polysilicon emitter region 41 and wells 20. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contacts 46 in the active regions of the device, e.g., wells 20, polysilicon emitter region 41 and extrinsic base 44.

FIG. 7 further shows interconnects or contacts 48 which contact to the silicide 46 and more particularly to the wells 20, emitter region 41 and extrinsic base 44. To form the contacts 48, an interlevel dielectric material or stack of interlevel dielectric materials 50 (e.g., SiN and $SiO_2$) over the structure. The interlevel dielectric material or stack of interlevel dielectric materials 50 may be deposited by a conventional deposition process, e.g., CVD. The interlevel dielectric material or stack of interlevel dielectric materials 50 will undergo lithography and etching processes, followed by deposition of a conductive material (e.g., contacts) within trenches formed in the interlevel dielectric material or stack of interlevel dielectric materials 50. The conductive material may be, for example, aluminum or tungsten, amongst other examples. Any excessive material on the interlevel dielectric material or stack of interlevel dielectric materials 50 may be removed by a conventional chemical mechanical planarization (CMP) process.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate;
   a collector region within the substrate;
   an emitter region over the substrate and which entirely comprises mono-crystalline silicon based material with an insulator material thereon;
   an intrinsic base under the emitter region and comprising semiconductor material;
   an extrinsic base surrounding the emitter and over the intrinsic base;
   a spacer separating the emitter region from the extrinsic base; and
   a plurality of semiconductor materials comprising SiGe material sandwiched between undoped semiconductor material, the SiGe material comprising a raised SiGe intrinsic base, and the undoped semiconductor material comprising an intrinsic emitter region and an intrinsic collector region.

2. The structure of claim 1, further comprising a silicide on the extrinsic base which surrounds the emitter region and intrinsic base and deep trench isolation structures extending into the substrate and which isolate all of the collection region, the emitter region, the intrinsic base and the extrinsic base.

3. The structure of claim 2, wherein the intrinsic base comprises a raised intrinsic base, and the silicide and the extrinsic base wrap-around the raised intrinsic base and further comprising shallow trench isolations structure, wherein the deep trench isolation structures extend through the shallow trench isolation structures.

4. The structure of claim 1, wherein the extrinsic base comprises Si material and further comprising a silicide on vertical and horizontal surfaces of the extrinsic base.

5. The structure of claim 4, wherein the extrinsic base comprises $P^+$ doped mono-crystalline silicon material and wraps around side surfaces of the emitter region.

6. The structure of claim 1, wherein the extrinsic base comprises SiGe material.

7. The structure of claim 1, wherein the extrinsic base is on top of the undoped semiconductor material.

8. The structure of claim 7, wherein the emitter region is on top of the undoped semiconductor region.

9. The structure of claim 8, wherein the undoped semiconductor region is on top of the semiconductor material of the intrinsic base.

10. The structure of claim 9, wherein the semiconductor material of the intrinsic base comprises SiGe material.

11. A structure comprising:
    a substrate;
    a collector region within the substrate;
    an emitter region over the substrate and which entirely comprises mono-crystalline silicon based material with an insulator material thereon;
    an intrinsic base under the emitter region and comprising semiconductor material; and
    an extrinsic base surrounding the emitter and over the intrinsic base,
    wherein silicide and extrinsic base wrap-around the intrinsic base, and further comprising a plurality of semiconductor materials over the substrate and comprising SiGe material sandwiched between a top and bottom undoped Si material, the SiGe material comprising a raised SiGe intrinsic base, the bottom undoped Si material comprising an intrinsic emitter region and the top undoped Si material comprising an intrinsic collector region, wherein the raised SiGe intrinsic base is on and overlaps with a shallow trench isolation structure.

12. A structure comprising:
    a collector region within a substrate;
    a raised intrinsic base over the substrate;
    an emitter comprising entirely mono-crystalline semiconductor material over the raised intrinsic base;
    an insulator material on sidewalls of the emitter;

an extrinsic base comprising mono-crystalline semiconductor material surrounding the emitter and the raised intrinsic base, the extrinsic base being separated from the emitter by the insulator material; and silicide over the extrinsic base; and wells in the substrate that electrically connect to the collector region, and a plurality of semiconductor materials on the substrate comprising SiGe material sandwiched between a top and a bottom undoped Si material, the SiGe material comprising a raised SiGe intrinsic base, the bottom undoped Si material comprising an intrinsic emitter region and the top undoped Si material comprising an intrinsic collector region, wherein the raised SiGe intrinsic base is on and overlaps with a shallow trench isolation structure.

13. The structure of claim 12, wherein the mono-crystalline semiconductor material comprises a silicon based material and further comprising deep trench isolation structures extending into the substrate and which isolate the collection region, the emitter, the raised intrinsic base and the extrinsic base.

14. The structure of claim 12, wherein the extrinsic base comprises Si material.

15. The structure of claim 14, wherein the Si material wraps around the raised intrinsic base.

16. The structure of claim 12, wherein the raised intrinsic base is between an upper and lower layer of undoped semiconductor material.

17. A method comprising:

forming a collector region within a substrate;

forming an emitter region over the substrate and which entirely comprises mono-crystalline silicon based material;

forming an intrinsic base under the emitter region and comprising semiconductor material;

forming an extrinsic base surrounding the emitter and over the intrinsic base;

forming a spacer separating the emitter region from the extrinsic base;

forming a plurality of semiconductor materials comprising SiGe material sandwiched between undoped semiconductor material, the SiGe material comprising a raised SiGe intrinsic base, and the undoped semiconductor material comprising an intrinsic emitter region and an intrinsic collector region.

* * * * *